United States Patent
Ghioni et al.

(10) Patent No.: US 11,895,812 B2
(45) Date of Patent: Feb. 6, 2024

(54) ADDITIVELY MANUFACTURED PROTRUSIONS

(71) Applicant: Microsoft Technology Licensing, LLC, Redmond, WA (US)

(72) Inventors: Lincoln Matthew Ghioni, Redmond, WA (US); Gary Russell McClary, Redmond, WA (US); Lawrence David Azzano, Mercer Island, WA (US); Minh Cao Nguyen, Bothell, WA (US); Scott Jeffrey Korn, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 1031 days.

(21) Appl. No.: 16/570,439

(22) Filed: Sep. 13, 2019

(65) Prior Publication Data
US 2020/0008326 A1    Jan. 2, 2020

Related U.S. Application Data

(63) Continuation of application No. 15/646,715, filed on Jul. 11, 2017, now Pat. No. 10,455,747.

(51) Int. Cl.
*H05K 9/00* (2006.01)
*H05K 1/18* (2006.01)
(Continued)

(52) U.S. Cl.
CPC ......... *H05K 9/0022* (2013.01); *B23K 26/342* (2015.10); *G06F 1/16* (2013.01);
(Continued)

(58) Field of Classification Search
None
See application file for complete search history.

(56) References Cited

U.S. PATENT DOCUMENTS

| | | | | |
|---|---|---|---|---|
| 2012/0177942 A1* | 7/2012 | Chang et al. | ............. | B32B 5/18 |
| | | | | 428/613 |
| 2013/0323444 A1* | 12/2013 | Ehemann et al. | ........ | C03C 3/00 |
| | | | | 428/34.4 |
| 2017/0144426 A1* | 5/2017 | Moore et al. | ........... | B32B 38/00 |

FOREIGN PATENT DOCUMENTS

| | | | | |
|---|---|---|---|---|
| FR | 3030110 A1 * | 6/2016 | ............. | H01L 24/73 |
| KR | 20170002609 A * | 1/2017 | ........... | B29C 64/118 |

(Continued)

OTHER PUBLICATIONS

Machine translation of FR 3030110 A1 performed on Aug. 3, 2022, Goubault et al. (Year: 2016).*

(Continued)

*Primary Examiner* — Dana Ross
*Assistant Examiner* — Kevin Guanhua Wen
(74) *Attorney, Agent, or Firm* — RAY QUINNEY & NEBEKER P.C.; Paul N. Taylor

(57) ABSTRACT

A computing component is described. The computing component includes a cosmetic prefabricated sheet of material. In some embodiments, the cosmetic prefabricated sheet of material may have a cosmetic surface and a protrusion surface. The computing component includes a protrusion extending from the protrusion surface of the cosmetic prefabricated sheet of material. In some embodiments, the cosmetic surface of the cosmetic prefabricated sheet of material is uniform in appearance to the naked eye. In some embodiments, the protrusion may have a base and an end. The base may have a cross-sectional width and the end may have a cross-sectional width. A difference in the cross-sectional width of the base and the cross-sectional width of the end may be less than 250 microns.

20 Claims, 5 Drawing Sheets

(51) Int. Cl.
    *G06F 1/18*           (2006.01)
    *G06F 1/16*           (2006.01)
    *H05K 1/02*           (2006.01)
    *B23K 26/342*       (2014.01)

(52) U.S. Cl.
    CPC ............ *G06F 1/18* (2013.01); *H05K 1/0216* (2013.01); *H05K 1/181* (2013.01); *H05K 2201/10371* (2013.01)

(56) References Cited

FOREIGN PATENT DOCUMENTS

| | | | | |
|---|---|---|---|---|
| KR | 20170002609 A1 * | 1/2017 | ........... | B29C 64/118 |
| WO | WO 2013167903 A1 * | 11/2013 | ............. | A61C 13/00 |

OTHER PUBLICATIONS

Machine translation of KR 20170002609 A1 performed on Aug. 3, 2022, Waatti et al. (Year: 2017).*

Machine translation of KR 20170002609 A performed on Jun. 22, 2023, Waatti et al. (Year: 2017).*

* cited by examiner

ADDITIVELY MANUFACTURED PROTRUSIONS

CROSS-REFERENCE TO RELATED APPLICATIONS

This application is a continuation of U.S. patent application Ser. No. 15/646,715, filed Jul. 11, 2017, which is hereby incorporated by reference in its entirety.

BACKGROUND

Background and Relevant Art

Use of computing devices is becoming more ubiquitous by the day. Computing devices range from standard desktop computers to wearable computing technology and beyond. As technology improves, computing devices continue to decrease in size.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

In one embodiment, a computing component is described. The computing component includes a cosmetic prefabricated sheet of material having a cosmetic surface and a protrusion surface. The computing component also includes a protrusion abutting and extending from the protrusion surface of the cosmetic prefabricated sheet of material. The cosmetic surface of the cosmetic prefabricated sheet of material is uniform in appearance to the naked eye.

In one embodiment, a computing component is described. The computing component includes a cosmetic prefabricated sheet of material. The computing component also includes a protrusion extending from a protrusion surface of the cosmetic prefabricated sheet of material. The protrusion has a base and an end. The base has a cross-sectional width and the end has a cross-sectional width. A difference in the cross-sectional width of the base and the cross-sectional width of the end is less than 250 microns.

In one embodiment, a computing component is described. The computing component includes a cosmetic prefabricated sheet of material. The computing component includes an electronic component connected to the cosmetic prefabricated sheet of material. The computing component also includes a protrusion extending from a protrusion surface of the cosmetic prefabricated sheet of material. The protrusion has a base and an end. The base has a cross-sectional width and the end has a cross-sectional width. A difference in the cross-sectional width of the base and the cross-sectional width of the end being less than 250 microns. The protrusion shields an electronic component.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 2-1 is a cutaway cross-sectional view of the protrusion and the sheet. As shown, a first layer may be applied to the sheet;

DETAILED DESCRIPTION

This disclosure generally relates to computing components with one or more additively manufactured protrusions, systems, and methods of manufacturing and use. More particularly, this disclosure generally relates to additively manufactured protrusions extending from a cosmetic surface.

Figure 1:
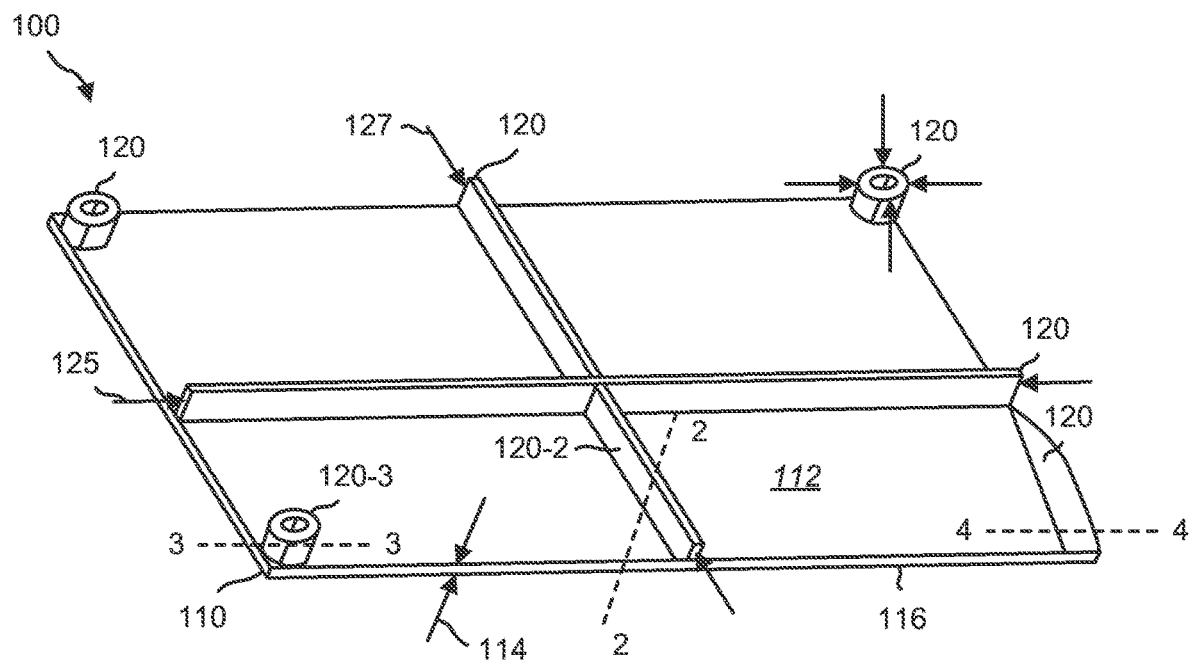
FIG. 1 is an isometric top view of an embodiment of a computing component.

FIG. 1 is an isometric top view of an embodiment of a computing component 100. The computing component 100 includes a sheet 110. The sheet 110 may be prefabricated. In other words, the sheet 110 may be preformed to its final shape. For example, the sheet 110 may be rolled or otherwise cold worked. The sheet 110 may include a protrusion surface 112 and a cosmetic surface 116.

The sheet 110 may have a thickness 114 between the cosmetic surface and the protrusion surface 112. The thickness may be less than 200 microns, 400 microns, 600 microns, 800 microns, 1 cm, 1.5 cm, 2 cm, or values therebetween. The sheet 110 may be flat. For example, the sheet 110 may be flat to within 100 microns over a 10 cm by 10 cm area, to within 150 microns over a 15 cm by 15 cm area, or to within 50 microns over a 5 cm by 5 cm area.

The sheet 110 may be formed of steel, copper, aluminum, stainless steel, titanium, magnesium, other materials, or alloys thereof. In at least one embodiment, the sheet 110 is formed of 303 half hard stainless steel. The cosmetic surface 116 may be treated. For example, the cosmetic surface 116 may be anodized, polished, plated, painted, or otherwise treated. The sheet 110 may have a yield stress of greater than 70 MPa, 250 MPa, 500 MPa, 600 MPa, 700 MPa, 900 MPa, or values therebetween. The sheet 110 may have a hardness of greater than Rockwell hardness of 60B, 87B, 60C, or values or ranges of values therebetween.

The cosmetic surface of the sheet 110 may be uniform in appearance to the naked eye. For example, observing the cosmetic surface of the sheet 110 may show that the cosmetic sheet is free from blemishes.

The computing component 100 may include one or more protrusions 120. The protrusions 120 may extend from the protrusion surface 112. The protrusions 120 may be additively manufactured to the sheet 110. In at least one embodiment, each protrusion 120 is formed on the sheet 110 and is not separately formed and attached to the sheet 110. The protrusions 120 may have lengths (e.g., length 125, 127).

As shown, protrusions 120 may be used for attachment points (e.g., bosses at the corners), structural reinforcements (e.g., the x-shaped protrusions), shielding elements (e.g., FIG. 8), three-dimensional contours (e.g., FIGS. 4 and 5), other purposes, or combinations thereof. The x-shaped protrusion shown in FIG. 1 may have an intersection. The intersection may form an L-, X-, Y-, or other shaped intersection. The X-shaped intersection is shown with orthogonal corners.

Figure 2:
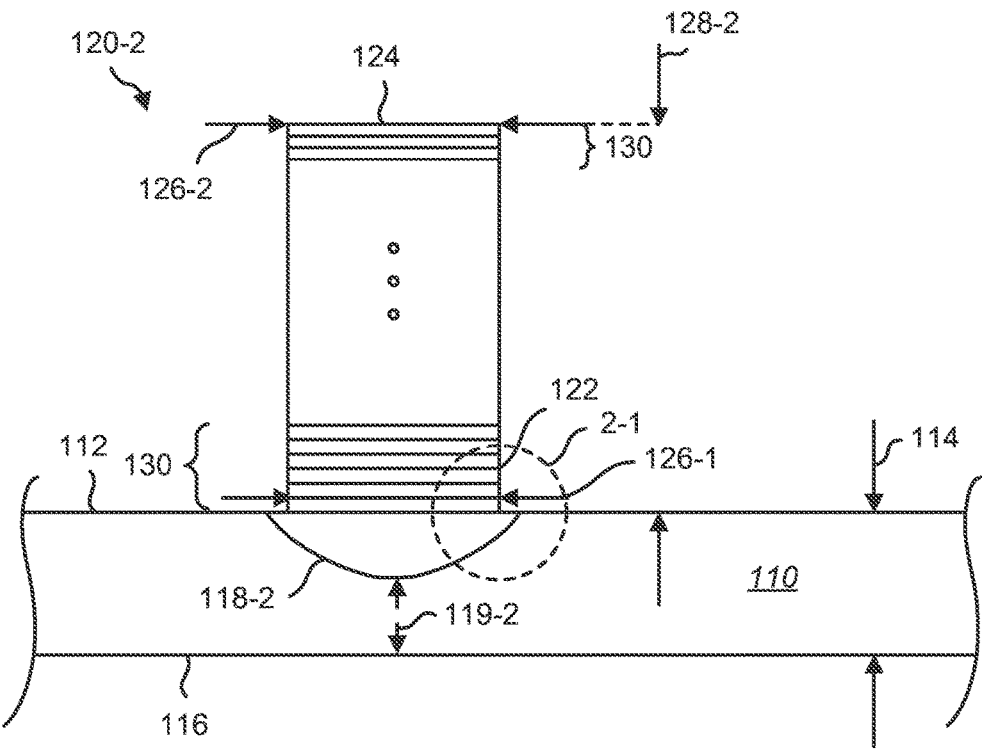
FIG. 2 is a cross sectional view of the embodiment of a computing component along line 2-2 of FIG. 1.
Figures 1, 2:
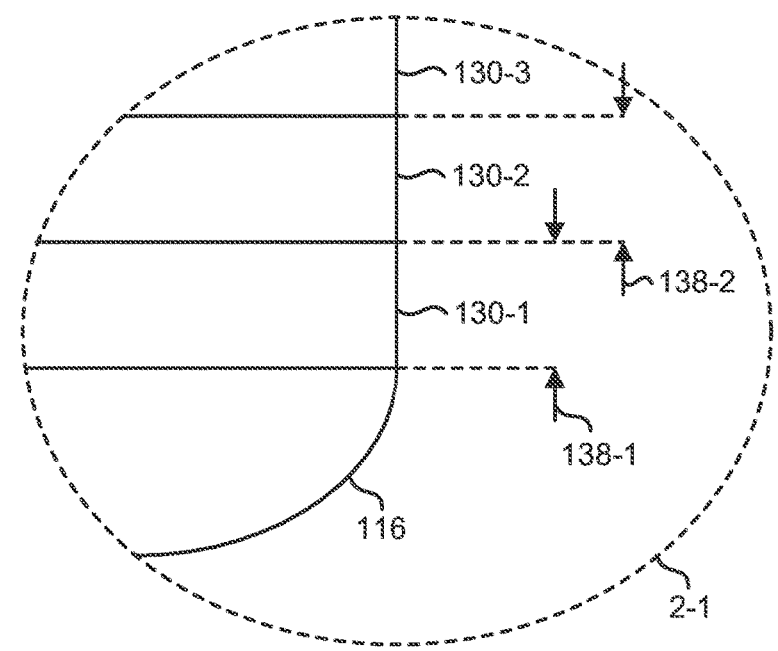

FIG. 2 is a cross sectional view of the embodiment of a computing component 100 along line 2-2 of FIG. 1. An embodiment of a protrusion 120-2 is shown. The protrusion 120-2 may be additively manufactured to the sheet 110. For example, the protrusion 120-2 may be formed on the sheet 110 by Selective Laser Melting (SLM).

The protrusion 120-2 may have a base 122 and an end 124. The end 124 may be used for structural support. For example, a separate component may be attached to the end 124. The base 122 may have a cross-sectional width 126-1 and the end 124 may have a cross-sectional width 126-2. The protrusion 120-2 may have a difference in cross-sectional width 126-1 at the base 122 and the cross-sectional width 126-2 at the end 124. As shown the difference may be zero. In other embodiments, the difference may be less than 250 microns.

As shown, the protrusion 120-2 may be applied to the protrusion surface 112 in layers 130. The protrusion 120-2 may have a height 128 (e.g., height 128-2). The height 128 may be greater than 200 microns, 300 microns, 400 microns, 600 microns, 1 mm, 2.5 mm, 5 mm, or any value therebetween.

Additively manufactured protrusions 120-2 may differ from a manufactured protrusion that is adhered to the sheet 110. For example, additively manufactured protrusions 120-2 may have a plurality of layers 130. FIG. 2-1 is a cutaway cross-sectional view of the protrusion 120-2 and the sheet 110. As shown, a first layer 130-1 may be applied to the sheet 110. For example, the first layer 130-1 may be sintered to the sheet 110. As the first layer 130-1 is applied to the sheet 110, heat may create a heat affected zone 118-2. The heat affected zone 118-2 may extend from the protrusion surface 112 toward the cosmetic surface 116. In at least one embodiment, applying layers 130 to form the protrusion 120-2 may reduce the size of the heat affected zone 118-2. A distance 119-2 between the cosmetic surface 116 and the heat affected zone 118-2 may be less than 20 microns, 40 microns, 60 microns, or any value or range of values therebetween.

If the heat affected zone 118-2 reaches the cosmetic surface 116, the cosmetic surface 116 may become visually and/or structurally modified (e.g., blemished). For example, an area of the cosmetic surface 116 adjacent (e.g., below) the protrusion 120-2 may have a different surface roughness than another area of the cosmetic surface 116 away from the protrusion 120-2. In another example, the area of the cosmetic surface 116 adjacent the protrusion 120-2 may exhibit recrystallization. Heat may, for example, modify (e.g., passivate) the crystal structure of the sheet 110. In another example, the area of the cosmetic surface 116 adjacent the protrusion 120-2 may have a different microstructure than areas away from the protrusion 120-2. In a further example, the area of the cosmetic surface 116 adjacent the protrusion 120-2 may have a different microstructural texture than areas away from the protrusion 120-2.

In at least one embodiment, a difference between an average surface roughness of the area of the cosmetic surface 116 adjacent the protrusion 120-2 and an average surface roughness of the area of the cosmetic surface 116 away from the protrusion 120-2 may be less than 0.01 μm Ra, 0.1 μm Ra, 0.5 μm Ra, 1 μm Ra, 5 μm Ra, 10 μm Ra, or values therebetween. In at least one embodiment, the surface roughness of the area of the cosmetic surface 116 adjacent the protrusion 120-2 and the surface roughness of the area of the cosmetic surface 116 away from the protrusion 120-2 may be the same. In at least one embodiment, the area of the cosmetic surface 116 adjacent the protrusion 120-2 may not exhibit recrystallization. In at least one embodiment, the surface roughness of the area of the cosmetic surface 116 adjacent the protrusion 120-2 and the surface roughness of the area of the cosmetic surface 116 away from the protrusion 120-2 have the same microstructural texture. In at least one embodiment, the area of the cosmetic surface 116 adjacent the protrusion 120-2 and the area of the cosmetic surface 116 away from the protrusion 120-2 have a uniform microstructural texture. In at least one embodiment, the area of the cosmetic surface 116 adjacent the protrusion 120-2 and the area of the cosmetic surface 116 away from the protrusion 120-2 have the same microstructural texture. In at least one embodiment, the microstructural texture of the area of the cosmetic surface 116 adjacent the protrusion 120-2 and the microstructural texture of the area of the cosmetic surface 116 away from the protrusion 120-2 may be uniform. In at least one embodiment, the cosmetic surface 116 may be a class A surface. In at least one embodiment, the cosmetic surface 116 has a uniform color. In at least one embodiment, the cosmetic surface 116 has a surface roughness of less than 0.01 μm Ra, 0.1 μm Ra, 0.5 μm Ra, 1 μm Ra, 5 μm Ra, 10 μm Ra, or values therebetween. In at least one embodiment, the cosmetic surface 116 has an average surface roughness of less than 0.5 μm Ra, 1.0 μm Ra, 4 μm Ra, or values therebetween. In at least one embodiment, the cosmetic surface 116 has a uniform surface roughness.

The first layer 130-1 may form a microstructural bond with the sheet 110. A second layer 130-2 may be applied to the first layer 130-1. A third layer 130-3 and successive layers 130 may be added until the protrusion 120-2 reaches a desired height 128. Each layer 130 has a height 138. As shown, the first layer 130-1 has a height 138-1.

Figure 3:
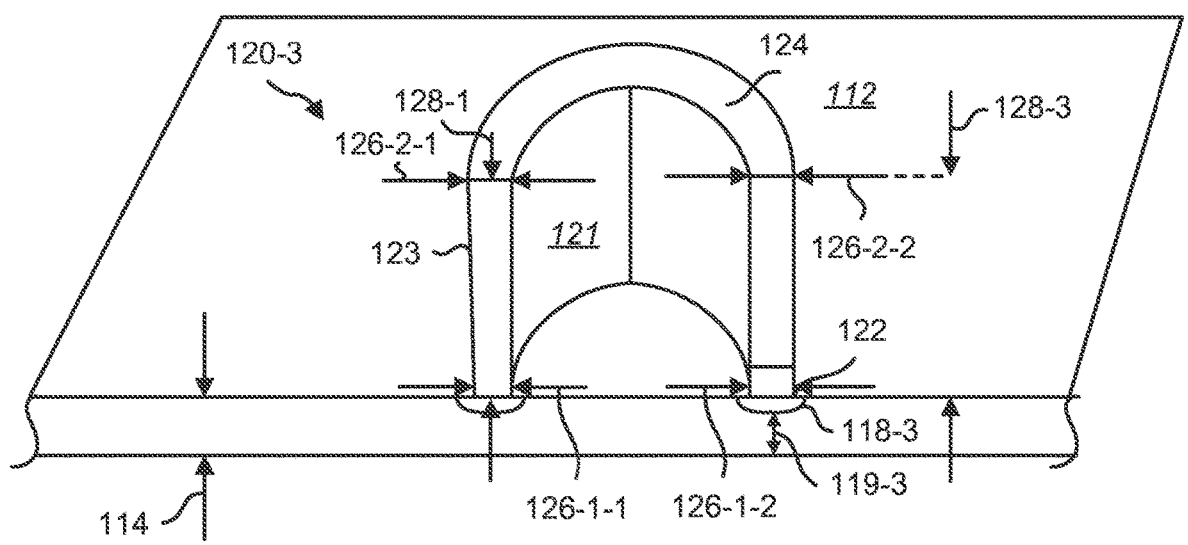
FIG. 3 is an elevated cross-sectional view of an embodiment of a protrusion along line 3-3 of FIG. 1.

FIG. 3 is an elevated cross-sectional view of an embodiment of a protrusion 120-3 along line 3-3 of FIG. 1. The protrusion 120-3 forms a boss. The boss may be used to attach parts together (e.g., screws, detents, snaps).

The protrusion 120-3 may have a base 122 and an end 124. The protrusion 120-3 may be rounded. The protrusion 120-3 may form an enclosure. The protrusion 120-3 may have an inner surface 121 and an outer surface 123. The inner surface 121 may be threaded. As shown, the protrusion 120-3, in cross-section, may have one or more thicknesses (e.g., widths 126). For example, the left side of the base 122 may have a cross-sectional width 126-1-1 and the right side of the base 122 may have a cross-sectional width 126-1-2. The left side of the end 124 may have a cross-sectional width 126-2-1 and the right side of the end 124 may have a cross-sectional width 126-2-2.

The protrusion 120-3 may have a difference in cross-sectional width 126-1 at the base 122 and the cross-sectional width 126-2 at the end 124. As shown the difference may be zero.

The protrusion 120-3 in FIG. 3 may have cross-sectional heights 128. The protrusion 120-3 may have a first cross-sectional height 128-1 and a second cross-sectional height 128-2. As shown, the first cross-sectional height 128-1 and the second cross-sectional height 128-2 are the same. In other embodiments, the cross-sectional heights 128 and/or widths 126 may be different.

The protrusion 120-3 may include layers (not shown) and may have a heat affected zone 118-3 adjacent the protrusion 120-3. A distance 119-3 between the cosmetic surface 116 and the heat affected zone 118-3 may be less than 20 microns, 40 microns, 60 microns, or any value or range of values therebetween.

Figure 4:
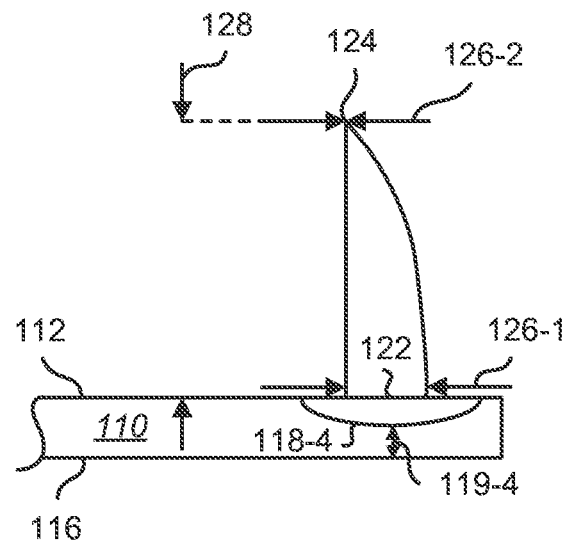
FIG. 4 is a cross-sectional side view of an embodiment of a protrusion along line 4-4 of FIG. 1.

FIG. 4 is a cross-sectional side view of an embodiment of a protrusion 120-4 along line 4-4 of FIG. 1. The protrusion 120-4 of FIG. 4 may be similar to the protrusions 120-2, 120-3 described in connection with FIGS. 2-3. The protrusion 120-4 forms a three-dimensional contour. The three-dimensional contour may be used to retain components within the sheet 110. The protrusion 120-4 may have a base 122 and an end 124. The protrusion 120-4 may be rounded along one side in cross-section.

The protrusion 120-4 may have a difference in cross-sectional width 126-1 at the base 122 and the cross-sectional width 126-2 at the end 124. As shown the difference may be 250 microns. In other words, the cross-sectional width 126-2 may be zero at the end 124 while the cross-sectional width 126-1 may be 250 microns at the base 122. The protrusion 120-4 in FIG. 4 has a cross-sectional height 128.

The protrusion 120-4 may include layers (not shown) and may have a heat affected zone 118-4 adjacent the protrusion 120-4. A distance 119-4 between the cosmetic surface 116 and the heat affected zone 118-4 may be less than 20 microns, 40 microns, 60 microns, or any value or range of values therebetween.

Figure 5:
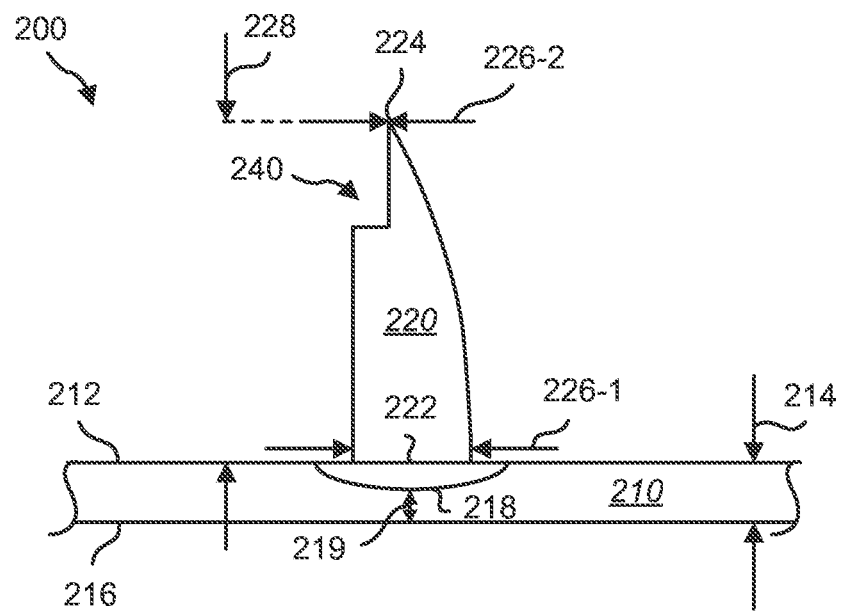
FIG. 5 is a cross-sectional side view of another embodiment of a computing component.

FIG. 5 is a cross-sectional side view of another embodiment of a computing component 200 with a protrusion 220 extending from a sheet 210. The protrusion 220 may be similar to the protrusions 120-2, 120-3, 120-4 described in connection with FIGS. 2-4 and like numbers may be used to designate like elements. The protrusion 220 forms a three-dimensional contour and a support structure 240. The support structure 240 may be used to support a component. For example, another sheet, which could be similar to sheets 110, 210 may rest on and/or be affixed to the support structure 240. The three-dimensional contour may be used to retain components within the sheet 210. The protrusion 220 may have a base 222 and an end 224. The protrusion 220 may be rounded along one side in cross-section.

The protrusion 220 may have a difference in cross-sectional width 226-1 at the base 222 and the cross-sectional width 226-2 at the end 224. As shown the difference may be 250 microns. In other words, the cross-sectional width 226-2 may be zero at the end 224 while the cross-sectional width 226-1 may be 250 microns at the base 222. The protrusion 220 in FIG. 4 has a cross-sectional height 228.

The protrusion 220 may include layers (not shown) and may have a heat affected zone 218 adjacent the protrusion 220. A distance 219 between the cosmetic surface 216 and the heat affected zone 218 may be less than 20 microns, 40 microns, 60 microns, or any value or range of values therebetween.

Figure 6:
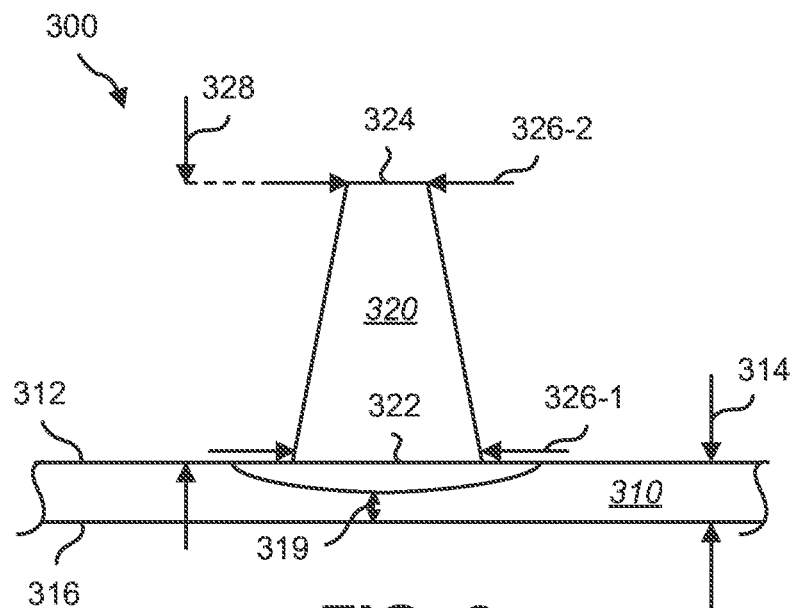
FIG. 6 is a cross-sectional side view of a further embodiment of a computing component.
Figure 7:
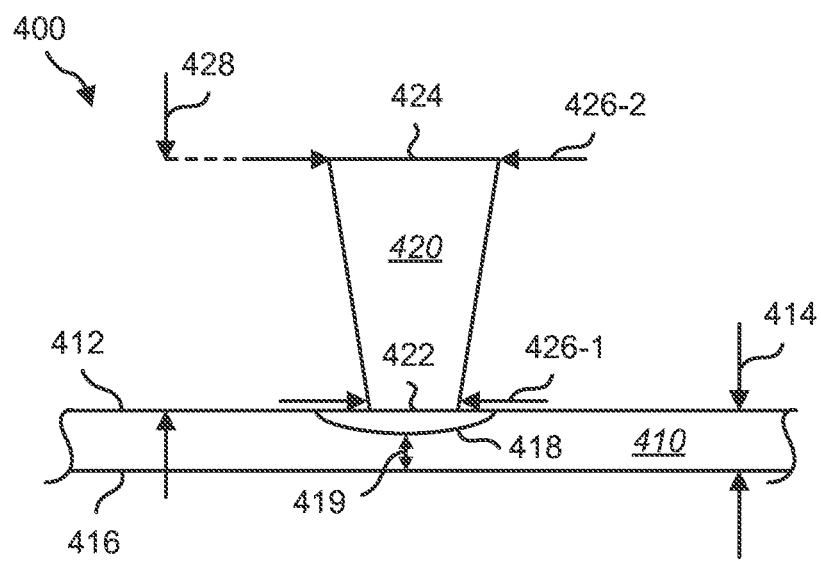
FIG. 7 is a cross-sectional side view of a yet further embodiment of a computing component.

FIGS. 6 and 7 are cross-sectional side views of embodiments computing components 300, 400 with protrusions 320, 420 extending from sheets 310, 410. For ease of discussion, the description will focus on the differences between the protrusions 320, 420 of FIGS. 6 and 7. The protrusions 320, 420 may be similar to the protrusions 120, 220 described in connection with FIGS. 1-5 and like numbers may be used to designate like elements.

As shown, the protrusions 320, 420 may vary in cross-sectional widths 326, 426. In the protrusion 320 shown in FIG. 6, the cross-sectional width 326-2 at the end 324 is smaller than the cross-sectional width 326-1 at the base 322. In the protrusion 420 shown in FIG. 7, the cross-sectional width 426-1 at the base 422 is smaller than the cross-sectional width 426-2 at the end 424. The difference in cross-sectional widths 326, 426 may be less than 250 microns. In some embodiments, the difference in cross-sectional widths 126, 226, 326, 426 may be less than 250 microns over a length. The length, in some embodiments, (e.g., from one end to another) of a protrusion 120, 220, 320, 420 may be from 100 microns to 1 mm, 1 cm, 10 cm, 50 cm, other lengths, or any values therebetween. In some embodiments, the difference in cross-sectional widths 126, 226, 326, 426 may be less than 250 microns over a length of at least 250 microns, 500 microns, 750 microns, 1 cm, 5 cm, 10 cm, 50 cm, or any value or range of values there between.

Figure 8:
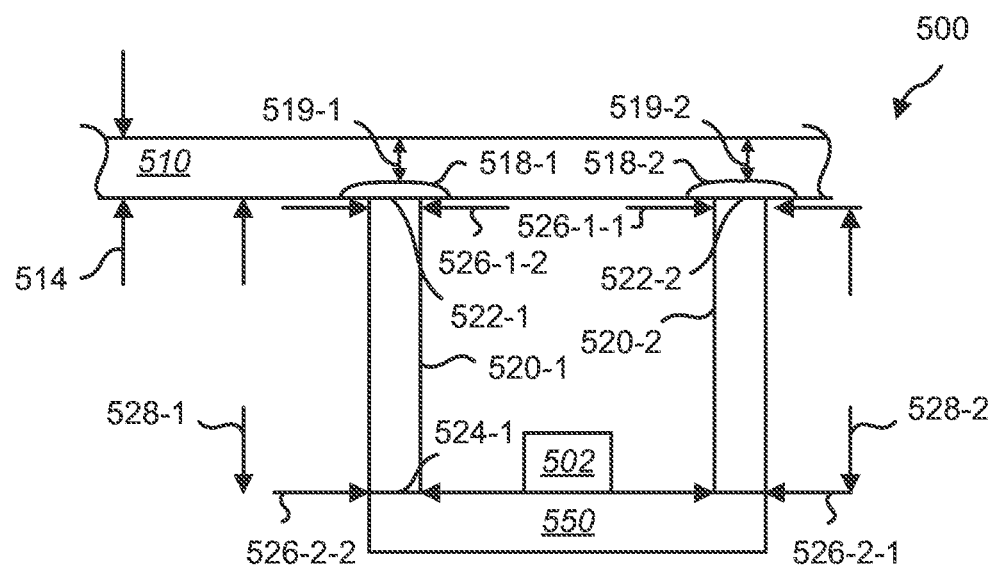
FIG. 8 is a cross-sectional side view of an embodiment of a computing component with a plurality of protrusions extending from a sheet and at least partially covered by a shield.

FIG. 8 is a cross-sectional side view of an embodiment of a computing component 500 with a pair of protrusions 520-1, 520-2 extending from a sheet 510 and attached to a printed circuit board (PCB) 550. The protrusions 520 may be similar to the protrusions 120-2, 120-3, 120-4, 220, 320, 420 described in connection with FIGS. 1-7 and like numbers may be used to designate like elements. The protrusions 520 may have a base 522 and an end 524. The PCB 550 may be secured to the ends 524-1, 524-2 of the protrusions 520-1, 520-2. The protrusions 520 and the sheet 510 may form a Faraday cage. The Faraday cage may shield a electronic component 502 connected to the PCB 550. The electronic component 502 may include a processor, memory, a communications device, input/output devices, other computing components or combinations thereof. One or more of the protrusions 520 may ground the electronic component 502 and/or the PCB 550 to the sheet 510.

The protrusion 520 may include layers (not shown) and may have a heat affected zone 518 adjacent the protrusion 520. A distance 519 between the cosmetic surface 516 and the heat affected zone 518 may be less than 20 microns, 40 microns, 60 microns, or any value or range of values therebetween.

Figure 9:
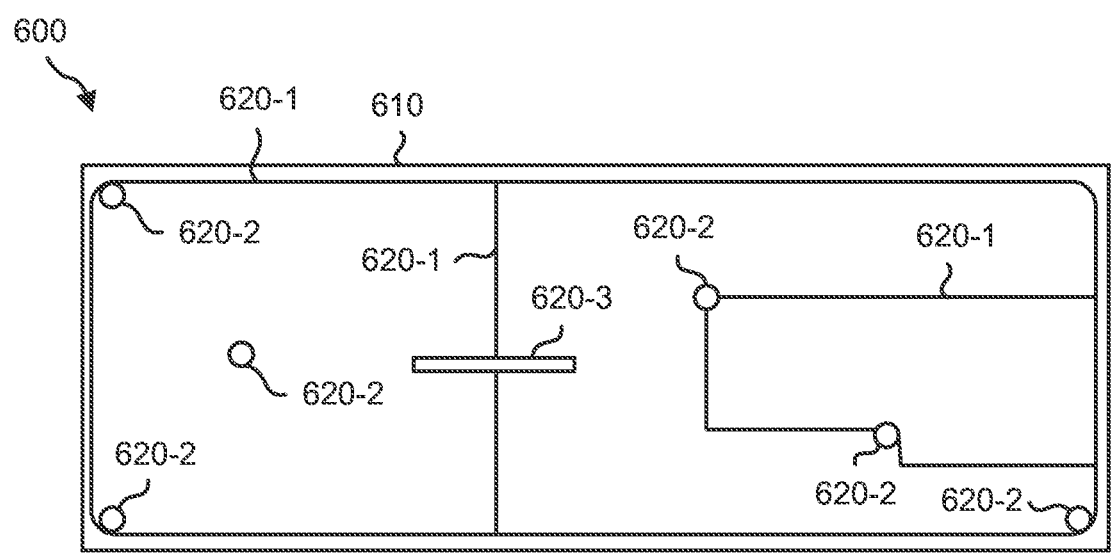
FIG. 9 is a top view of another embodiment of a computing component.

FIG. 9 is a top view of an embodiment of a computing component 600. The computing component 600 may include a sheet 610 and plurality of protrusions 620 extending from the sheet. The protrusions 620 may be similar to the protrusions 120, 220, 320, 420, 520 described in connection with FIGS. 1-8 and like numbers may be used to designate like elements.

The sheet has multiple, support protrusions 620-1, multiple boss protrusions 620-2, and a larger support portion 630-3. One or more boss protrusions 620-2 may abut one or more support protrusions 620-1. For example, one or more support protrusions 620-1 may abut one or more boss protrusions 620-2. As shown, the one or more support protrusions 620-1 may share a wall with one or more boss protrusions 620-2 and/or may abut a will of one or more boss protrusions 620-2.

A method of manufacturing a computing component, such as the computing components 100, 200, 300, 400, 500, 600 may include fastening a sheet within an additive manufacturing apparatus. A plurality of layers may be sintered to the sheet. Sintering may create a heat affected zone. The heat affected zone may not extend to a cosmetic surface of the sheet.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A method of manufacturing a computing component, comprising:
   positioning a cosmetic prefabricated sheet of material including a cosmetic surface and a protrusion surface;
   forming a protrusion on the protrusion surface of the cosmetic prefabricated sheet of material by selective laser melting a plurality of layers of the protrusion including an innermost layer and an outermost layer formed above the innermost layer; and
   creating a heat affected zone while forming each of the plurality of layers of the protrusion that does not extend to the cosmetic surface of the cosmetic prefabricated sheet of material based on the protrusion being formed of the plurality of selective laser melted layers.

2. The method of claim 1, wherein a distance between the heat affected zone and the cosmetic surface is greater than 20 µm.

3. The method of claim 1, further comprising forming one or more intermediate layers of the protrusion on the innermost layer of the protrusion.

4. The method of claim 3, wherein forming the one or more intermediate layers of the protrusion further includes forming the one or more intermediate layers such that the heat affected zone does not extend to the cosmetic surface of the cosmetic prefabricated sheet of material.

5. The method of claim 1, wherein forming the innermost layer of the protrusion comprises forming a microstructural bond between the innermost layer and the cosmetic prefabricated sheet of material.

6. The method of claim 1, wherein after forming the innermost layer of the protrusion, the cosmetic surface of the cosmetic prefabricated sheet of material does not exhibit recrystallization.

7. The method of claim 1, wherein an area of the cosmetic surface beneath the protrusion and an area of the cosmetic surface adjacent the protrusion have the same microstructural texture.

8. The method of claim 1, wherein after forming the innermost layer of the protrusion, the cosmetic surface has an average surface roughness of less than 2 µm Ra.

9. The method of claim 1, wherein the cosmetic prefabricated sheet of material has a thickness less than 2 mm.

10. The method of claim 1, wherein the cosmetic prefabricated sheet of material is flat to within 100 microns over a 10 cm by 10 cm area.

11. A method of manufacturing a computing component, comprising:
    positioning a cosmetic prefabricated sheet of material including a cosmetic surface and a protrusion surface;
    using Selective Laser Melting (SLM):
        forming, on the protrusion surface of the cosmetic prefabricated sheet of material, a protrusion having a plurality of layers and being configured as an attachment point or a structural reinforcement for a computing device component; forming the protrusion including:

forming an innermost layer of the protrusion on the protrusion surface of the cosmetic prefabricated sheet of material, the innermost layer comprising a base of the protrusion; and forming an outermost layer of the protrusion above the innermost layer, the outermost layer of the protrusion comprising an end of the protrusion.

12. The method of claim 11, wherein the protrusion has a height from the base to the end of greater than 600 microns.

13. The method of claim 11, wherein the protrusion forms an L-shape with an orthogonal corner as viewed from above the protrusion surface.

14. The method of claim 11, wherein the protrusion forms a boss.

15. The method of claim 14, wherein the protrusion includes a support protrusion that forms a straight section connected to the protrusion that forms the boss.

16. The method of claim 11, wherein the cosmetic prefabricated sheet of material has a yield stress of greater than 500 MPa.

17. The method of claim 11, wherein the cosmetic prefabricated sheet of material has a hardness of greater than 50 Rockwell Hardness B.

18. The method of claim 11, wherein the cosmetic prefabricated sheet of material is cold worked.

19. The method of claim 1, wherein the protrusion has a difference in cross-sectional width across a height of the protrusion that is less than 250 microns.

20. The method of claim 11, wherein the base of the protrusion has a base cross-sectional width and the end of the protrusion has an end cross-sectional width, and wherein the difference between the base cross-sectional width and the end cross-sectional width is less than 250 microns.

* * * * *